United States Patent
Vispute et al.

(10) Patent No.: US 7,494,546 B1
(45) Date of Patent: Feb. 24, 2009

(54) METHOD OF GROWING INSULATING, SEMICONDUCTING, AND CONDUCTING GROUP III-NITRIDE THIN FILMS AND COATINGS, AND USE AS RADIATION HARD COATINGS FOR ELECTRONICS AND OPTOELECTRONIC DEVICES

(75) Inventors: Ratnakar D. Vispute, Columbia, MD (US); Evan Bertrue Jones, Baltimore, MD (US)

(73) Assignee: Blue Wave Semicodnuctors, Inc., Columbia, MD (US)

( * ) Notice: Subject to any disclaimer, the term of this patent is extended or adjusted under 35 U.S.C. 154(b) by 0 days.

(21) Appl. No.: 11/879,165

(22) Filed: Jul. 16, 2007

Related U.S. Application Data

(60) Provisional application No. 60/830,713, filed on Jul. 14, 2006.

(51) Int. Cl.
*C30B 25/12* (2006.01)
*H01L 21/20* (2006.01)

(52) U.S. Cl. ............................. 117/88; 117/89; 117/95; 117/103; 257/1; 438/106

(58) Field of Classification Search .................. 117/84, 117/88, 89, 95, 103; 438/106
See application file for complete search history.

(56) References Cited

U.S. PATENT DOCUMENTS

| | | | | |
|---|---|---|---|---|
| 6,129,465 A * | 10/2000 | Hoyt et al. | .................. | 400/578 |
| 6,323,053 B1 * | 11/2001 | Nishikawa et al. | ............ | 438/46 |
| 6,335,218 B1 * | 1/2002 | Ota et al. | ...................... | 438/46 |
| 6,452,216 B1 * | 9/2002 | Tsuda et al. | .................. | 257/94 |
| 6,521,917 B1 * | 2/2003 | Takayama et al. | ........... | 257/103 |
| 6,534,332 B2 * | 3/2003 | Bourret-Courchesne | ..... | 438/47 |
| 6,589,857 B2 * | 7/2003 | Ogawa et al. | ............... | 438/502 |
| 6,765,244 B2 * | 7/2004 | Shibata et al. | .............. | 257/200 |
| 6,781,164 B2 * | 8/2004 | Hori et al. | .................... | 257/194 |
| 6,872,967 B2 * | 3/2005 | Kano et al. | ..................... | 257/15 |
| 6,888,867 B2 * | 5/2005 | Sawaki et al. | ............ | 372/46.01 |
| 6,891,201 B2 * | 5/2005 | Tsuda et al. | .................. | 257/88 |
| 6,903,364 B1 * | 6/2005 | Takayama et al. | ............. | 257/12 |
| 6,984,840 B2 * | 1/2006 | Kuramata et al. | ............. | 257/11 |
| 6,984,841 B2 * | 1/2006 | Tsuda et al. | .................. | 257/12 |
| 7,009,215 B2 * | 3/2006 | D'Evelyn et al. | ............. | 257/98 |
| 7,033,439 B2 * | 4/2006 | Shibata et al. | .............. | 117/200 |
| 7,033,858 B2 * | 4/2006 | Chai et al. | .................. | 438/106 |
| 7,180,088 B2 * | 2/2007 | Sugawara | ..................... | 257/13 |
| 7,193,246 B1 * | 3/2007 | Tanizawa et al. | .............. | 257/94 |

* cited by examiner

*Primary Examiner*—Felisa C Hiteshew
(74) *Attorney, Agent, or Firm*—Rosenberg, Klein & Lee

(57) ABSTRACT

The present invention describes use of electron beam evaporation method for fabrication of group III-nitride thin films. The fabricated thin films found to have desirable crystalline and optical properties. These films and their properties could be used for protecting electronic devices under space radiation applications such as solar cell operating in space.

7 Claims, 10 Drawing Sheets

METHOD OF GROWING INSULATING, SEMICONDUCTING, AND CONDUCTING GROUP III-NITRIDE THIN FILMS AND COATINGS, AND USE AS RADIATION HARD COATINGS FOR ELECTRONICS AND OPTOELECTRONIC DEVICES

CROSS REFERENCE

"This application claims priority to U.S. Provisional Application Ser. No. 60/830,713 filed Jul. 14, 2006, entitled "METHOD OF GROWING INSULATING, SEMICONDUCTING, AND CONDUCTING GROUP III-NITRIDE THIN FILMS AND COATINGS, AND USE AS RADIATION HARD COATINGS FOR ELECTRONICS AND OPTOELECTRONIC DEVICES", which is incorporated herein by reference in its entirety."

STATEMENT REGARDING FEDERALLY SPONSORED RESEARCH OR DEVELOPMENT

This invention was made with Government support under Contract No. FA9453-04-M-0116 and FA 9453-050C-0039 awarded by the U.S. Air Force. The Government has certain rights in the invention.

BACKGROUND OF THE INVENTION (A) Field of the Invention

The present invention relates to a method for fabricating group III (Al, Ga, and In)-Nitride thin films to build and also protect electronic devices. Particularly, this invention discloses a method for fabricating thin films of AlN, GaN, InN, and Al—Ga—In multicomponent nitride alloy on sapphire and glass by electron beam evaporation technique and demonstrate a method for applying the thin film coating technique to protect solar cell against space radiation and atmospheric induced degradation.

(B) Description of the Related Art

Group III-nitride system such as AlN, GaN, InN, and their alloys such as $Al_{(1-x)}Ga_xN$, $In_{(1-x)}Ga_xN$, $Al_{(1-x)}In_xN$ are widely used in the semiconductor industry in a variety of applications because of its wide and tunable band gap, high thermal conductance, piezoelectric qualities, and radiation hardness [references 0035-0062]. The thermal stability and doping capabilities make this system very useful for UV, blue and green LED and Laser Diodes, visible blind UV photo detectors, rf electronics and high temperature and high power electronics. The current technologies used in producing AlN, GaN, and InN thin films and their alloys are Metal Organic Chemical Vapor Deposition (MOCVD), Hydride Vapor Phase Epitaxy (HVP), Molecular Beam Epitaxy (MBE), and Pulsed Laser Deposition (PLD) techniques. There is only one report that presents deposition of AlN thin film using electron beam deposition [0062]. This paper reports fabrication of AlN thin film for silicon-on-insulator (SOI) application. It does not report or represent any advancement of their method towards fabrication of optical coatings and crystalline AlN, GaN, Al—Ga—In—N alloy films that are needed for electronic and/or optoelectronic device applications and their applications for radiation hard electronics.

Due to large band gaps of AlN (6.2 eV) and GaN (3.4 eV) and their alloys ($Al_{(1-x)}Ga_xN$ with band gap ranging from 3.4 eV to 6.2 eV as a function of composition) coatings and thin films of group III-nitride material system are useful for optically transparent window in the visible range of optical spectrum for electronic devices such as solar cells, detectors, uv-visible, infrared cameras, lasers and their surface protection against any environment. For example, cover glasses made from $SiO_2$ manufactured by a number of purveyors are currently used to shield solar cells from atmospheric degradation and damaging space radiation (for solar cell operating in space). Particularly, for space application, the effectiveness of cover glasses is, however, limited and leads to solar life limitations or weight penalties which are undesirable.

This patent discloses a method of fabrication of III-Nitride system using electron beam evaporation technique in reactive atmosphere created by e-beam evaporated metal and reactive ammonia ($NH_3$) and use of such coatings and buffer layers for fabrication of optoelectronic, electronic devices, radiation hard electronics, high-temperature and high power electronics, with emphasis on method for fabricating cover for device protection.

SUMMARY OF THE INVENTION

The present invention provides a method for fabricating AlN, GaN, InN, and their alloy thin films on sapphire, glass, silicon, GaAs, solar sell devices, detectors and electronic components by reactive electron beam evaporation in an $NH_3$ atmosphere. Using this method, large area III-nitride coatings and thin films can be fabricated. This invention thus can produce low cost and large area production of optically transparent and direct band gap materials capable of doping n-type and p-type impurities producing insulating, semiconducting, and conducting electronic grade coatings capable of surface protection of electronic devices and producing buffer layers and active device materials required for blue LEDs, laser diodes, high temperature and high power III-nitride devices, solar cells, and microelectromechnical (MEMS) devices.

The present invention proposes use of this method to produce compositionally tuned III-nitrides for device application such as surface protection of solar cell. To demonstrate application of this method, inventions of radiation hard coatings based on AlN for solar cell protection against space radiation and development of AlN buffer layer for active electronic applications are provided.

DETAILED DESCRIPTION OF THE INVENTION

Figure 1:
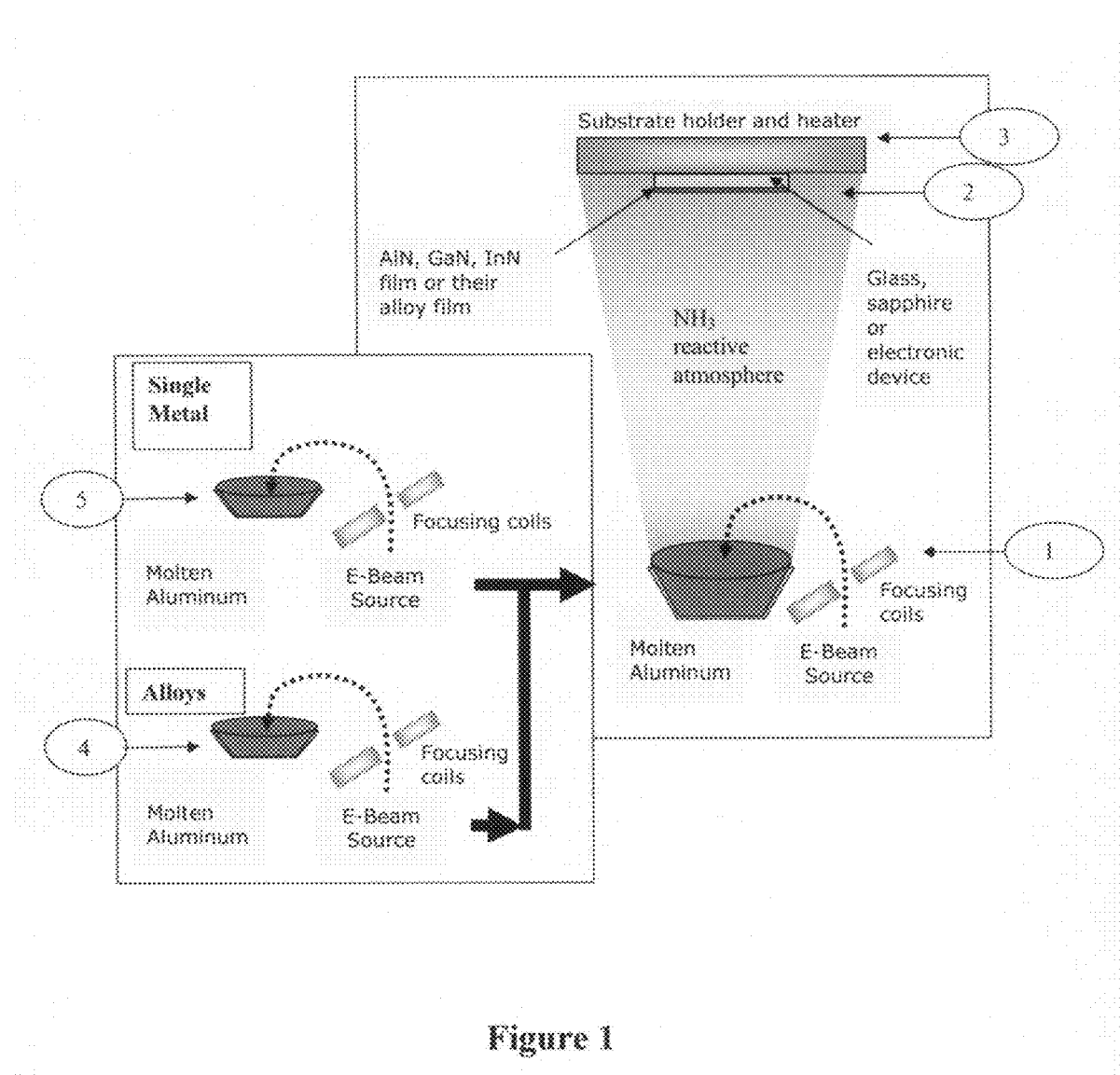
FIG. 1 Schematic representation of reactive electron beam evaporation and deposition method for group III-nitride films.

The method utilizes a standard high vacuum processing chamber with electron beam evaporation (E-Beam) system constructed by Blue Wave Semiconductors, Inc. Special features of the coating system include a large diameter chamber (ID 46 cm) for accommodation of large area substrate, adjustable beam voltage from 6 kV to 10 kV, a gas inlet for reactive gas processes, a substrate heater capable of reaching 1000° C. at the heater surface, and a quartz crystal in-situ thickness monitor for deposition rate and thickness control. A schematic representation of electron beam evaporation method for fabrication of group III-nitride films is shown in FIG. 1. Section 1 represents e-beam processing of metal. Sections 2 and 3 represent film on substrate heated by the external substrate heater. Sections 4 and 5 indicate fabrication of one single element nitride versus alloy (more than 2 elements) film using metal versus alloy melting in crucible by e-beam.

AlN thin film deposits by a reactive process of energetic aluminum vapor produced by electron beam with ammonia gas on sapphire or quartz, or glass or silicon or electronic devices such as solar cell or detector or laser diode or light emitting diode, or transistors such as field effect transistors (FET) or MOSFETs or similar devices. The source material was pure aluminum pellets (99.999). The aluminum was evaporated in a partial pressure ranging from $1 \times 10^{-1}$ Torr to $10^{-8}$ Torr of pure ammonia (99.999). First, a thin AlN buffer layer was grown at a substrate temperature of RT (room temperature) to 1000° C. at a deposition rate of aluminum film optimized to achieve desired results for a thickness of aluminum film in the range of 10 Å to 1000 Å. A second layer is then grown at a substrate temperature of RT to 1000° C. at a rate optimized to achieve desired results for a desired thickness. Similar process can be extended to GaN and InN and their alloys such as GaAlN and GaInN. To make these alloys thin films and heterostructures, two metals of appropriate weight fraction are kept in a crucible.

The material being evaporated is placed in the crucible and occupies about 80% of the crucible volume. This precaution is necessary to provide a stable molten pool of Al metal and avoiding accidental overflow or jumping of source chunks. The crucibles are water cooled to reduce the heating effects. Additionally, the crucible inserts are used to reduce the heat flow during deposition thereby allowing higher evaporation rates.

When energetic electron beam falls on the metals, they go through melting and then mixing of two liquids in the crucible making it homogeneous metal alloys for the evaporation. By adjusting the initial weight of the metals, desired alloy composition in the depositing film can be obtained which essentially controls the structural, optical, electrical and doping properties. The evaporation rate of individual metal element in the crucible is also found to be dependent on the electron beam power. For electronic doping epitaxial thin films for device fabrication, impurity elements can be added into the evaporation alloy. System is designed to have multiple pockets in which different metals, alloys or doped alloys can be loaded and in-situ heterostructures of electronic and optoelectronic materials can be fabricated at room temperature or elevated temperatures. Chemical doping through injecting small amount of doping gas is also attainable while electron beam deposition process.

EXAMPLES

Thin Film and Coating Optimization

Experimentation showed that quality of films depended on the deposition rate of aluminum, the flow rate of ammonia and the substrate temperature. Qualitatively, higher temperatures required higher gas flow rates and higher aluminum deposition rates. When the process was under saturated with aluminum deposition the films were amorphous and powder like. When the process was over saturated with aluminum deposition the films were metallic.

We have optimized deposition process parameters for fabrication of high quality thin film nitride and oxide layers. Among various process parameters, evaporation rate and substrate temperature are the most important parameters influencing properties of the deposited films. Primary consideration when deciding a deposition rate, using electron gun (e-gun), is the film properties at the development stage and eventually the production rate, since very high rates are not compatible with certain film properties. It is thus important to consider various parameters in e-gun evaporation since the beginning of the product development. The ease of evaporation and fabricating good quality thin films depends on different factors, e.g. power supply ratings, system geometry, source material, evaporation rate, substrate-source distance etc. In the present case, the desired evaporation rates are easily possible by 10 kilowatt power supply interfaced with the e-gun.

AlN coatings have been characterized by x-ray diffraction, UV-Visible spectroscopy, scanning electron microscopy and electrical resistivity. X-ray diffraction results indicated that the coatings fabricated under 300° C. are essentially amorphous to nanocrystalline regime while coatings fabricated at higher temperatures (400-900° C.) are oriented and crystalline. No detectable metallic aluminum impurity was observed.

Figure 2:
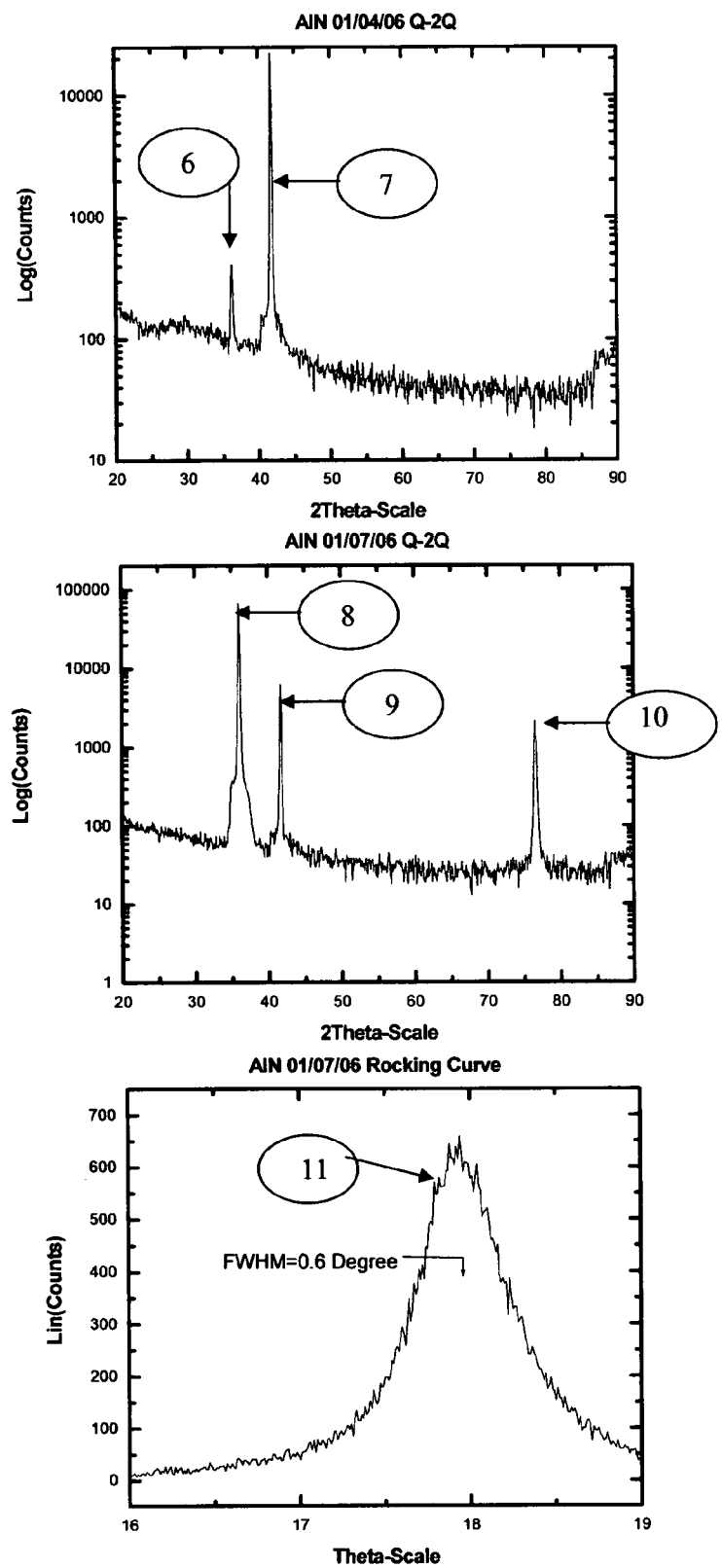
FIG. 2 X-ray diffraction patterns of AlN film deposited by electron beam evaporation method: (a) AlN film deposited at 400 C, (b) AlN film deposited at 800 C, and (c) rocking curve of AlN (0002) peak.
Figure 3:
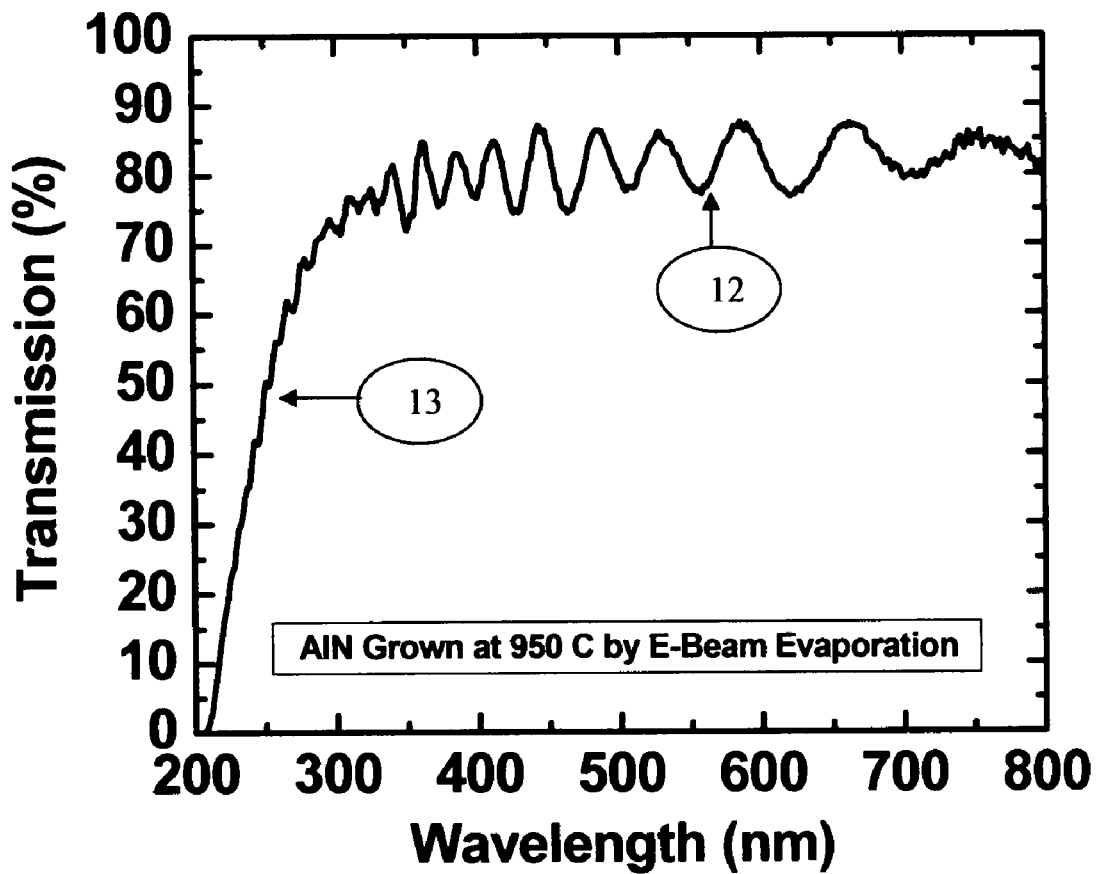
FIG. 3 UV-Visible spectrum of AlN film grown using electron beam evaporation method.
Figure 4:
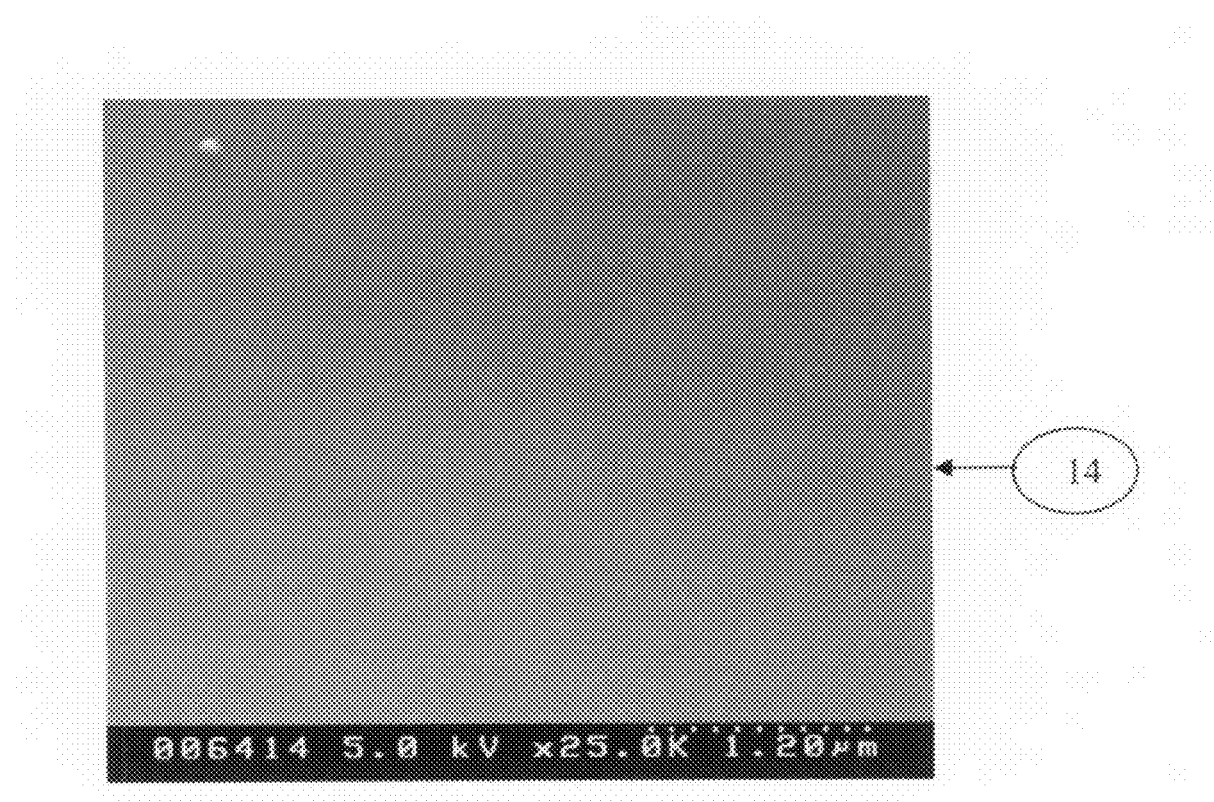
FIG. 4 Scanning electron microscopy of AlN film grown using electron beam evaporation method.

FIGS. 2 (*a,b* and *c*) are x-ray diffraction patterns of AlN films grown by electron beam evaporation method. A buffer layer was also developed and used to compensate for film stress. XRD results indicate that the crystalline quality improves from 400° C. deposition temperature (FIG. 2*a*) to 800° C. (FIG. 2*b*). Sections 6 and 7 show AlN (0002) and sapphire (0006) peaks, respectively for film fabricated at 400 C. Sections 8, 9, and 10 show AlN (0002), sapphire (0006), and AlN (0004) peaks, respectively for film fabricated at 800 C. FIG. 2*c* shows rocking curve measurement of crystalline AlN film showing well oriented c-axis normal to the substrate plan. Section 11 shows peak for AlN (0002) taken during rocking curve measurement. Note that the coating grown at 400° C. also has high purity phase. It consisted of nanocrystalline and microcrystalline AlN and could be effective for stress reduction while grown thicker coatings on glass. A UV-Visible spectrum of Blue Wave's AlN film is shown in FIG. 3. The film is optically transparent (>75%, section 12) and have smooth and uniform surface roughness RMS value of 0.46 nm. The band gap calculated from the absorption edge (section 13) indicated that the band gap of the film is 6.0 eV. The scanning electron microscopy of the AlN film is shown in FIG. 4 indicating smooth features (section 14) which are required for good quality optical coatings. We have also discovered that there is a critical deposition rate associated with the growth temperature which allows epitaxial films to be grown at high rates in high temperatures and slow rates at low temperatures.

Previous experiments revealed that metal vapor evaporation requires a specific growth rate for a temperature. If the rate was too high we got metallic films and if the rate was too low we got a particulate material. There exists a phase diagram of growth temperature, $NH_3$ pressure, and evaporation rate.

Figure 5:
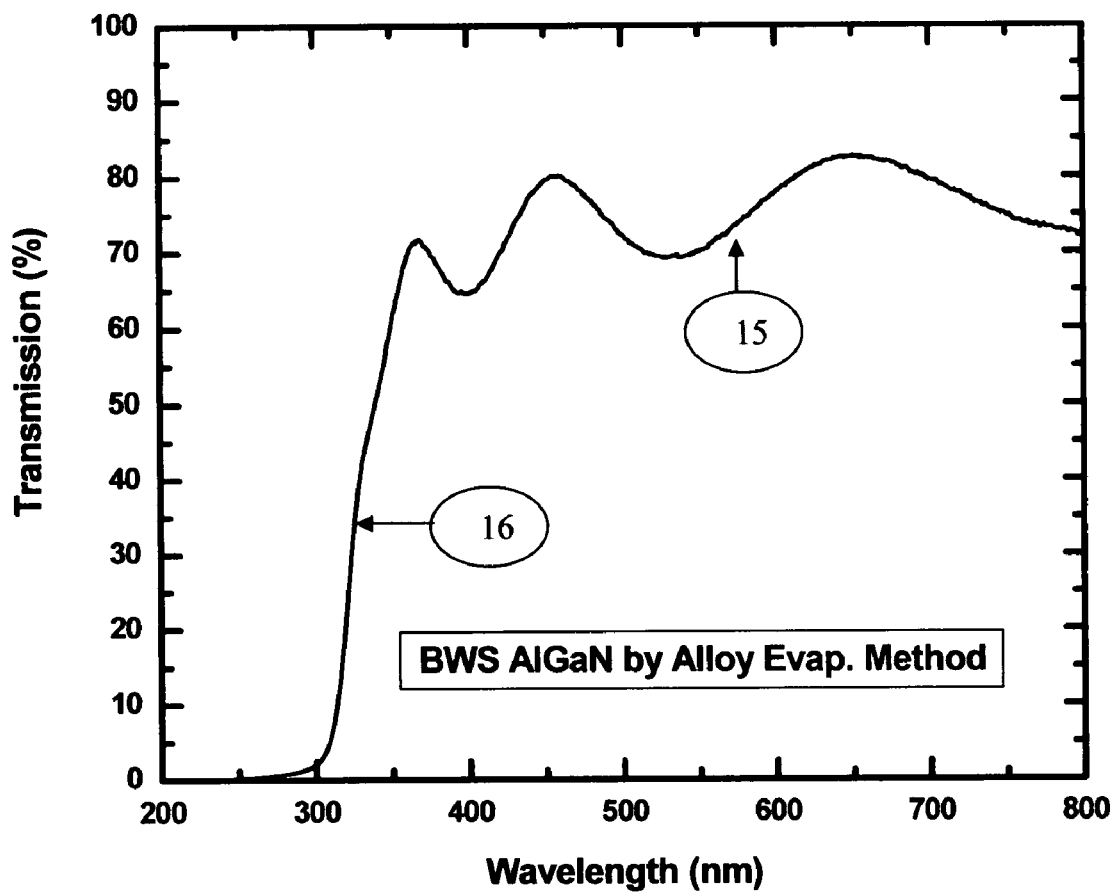
FIG. 5 UV-Visible spectrum of AlGaN film grown using electron beam evaporation method.

We made similar attempts for fabrication of GaN film using Ga evaporation. The film was grown in an ammonia atmosphere ($1 \times 10^4$ Torr). Using a temperature of 800° C. has so far given us the best results with a deposition rate of 3-4 Å/s. We have also successfully achieved AlGaN alloys in which UV cut-off can be tunable. For example, FIG. 5 shows UV Visible spectrum of AlGaN alloy indicating high optical transparency (>70%, section 15) and UV cut-off wavelength about 300 nm (section 16). To our knowledge, this is the first report of AlGaN coating using electron beam evaporation technique.

Figure 6:
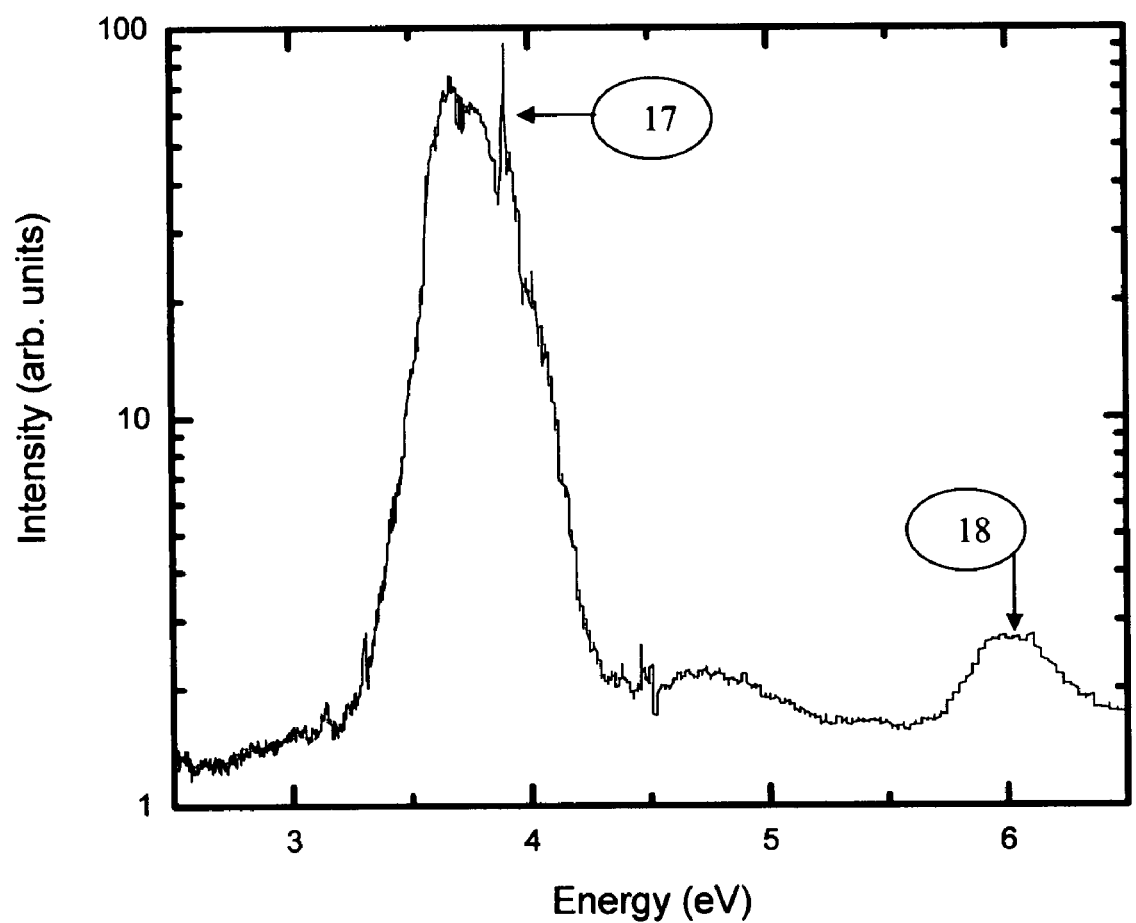
FIG. 6 Cathodoluminescence of AlN film.

FIG. 6 shows cathololuminescence of AlGN optical coating with alN buffer layer. There are clear peaks at about 6 eV and 3.8 eV indicating band edge emission of AlN and AlGaN alloy indicating high optical quality of the film.

Use of ALN and Algan Film as a Protective Coating for Solar Cell

The present invention relates to protecting the above described on board solar cells and/or the related electronic circuits which are exposed to the radiation commonly experienced in space. In essence, the invention is to apply radiation-hard coatings and materials or parts made there from to be utilized for protecting solar cells in space applications specifically in space vehicles and/or space ships and/or space shuttles. The protection can be provided with radiation-hard coatings in conjunction with or without coverglass. In addition to energetic particles that exist in space, ultra violet (UV) photons are also damaging to space electronics. This means that the ability to tune the bandage of the coating to allow maximal transmission and control UV absorption in visible range through UV is more critical.

Figure 7:
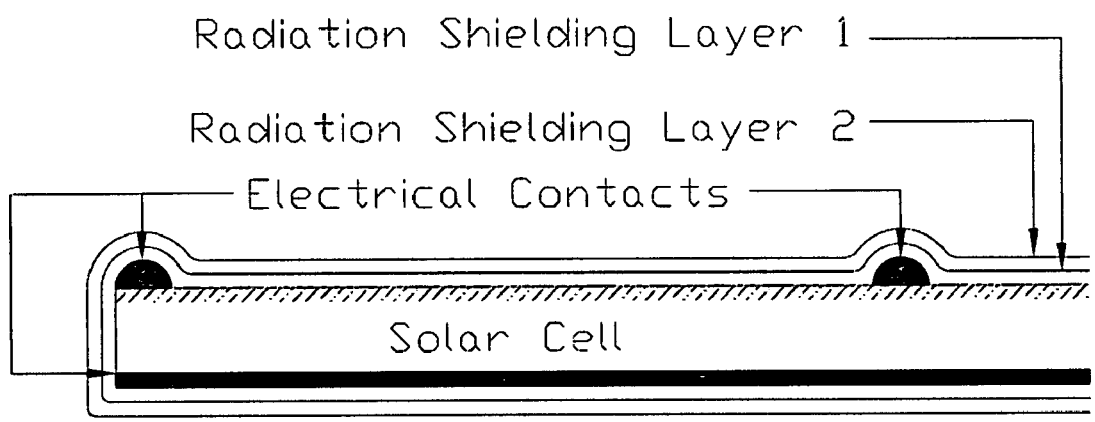
FIG. 7 Schematics of coating of solar cell.
Figure 8:
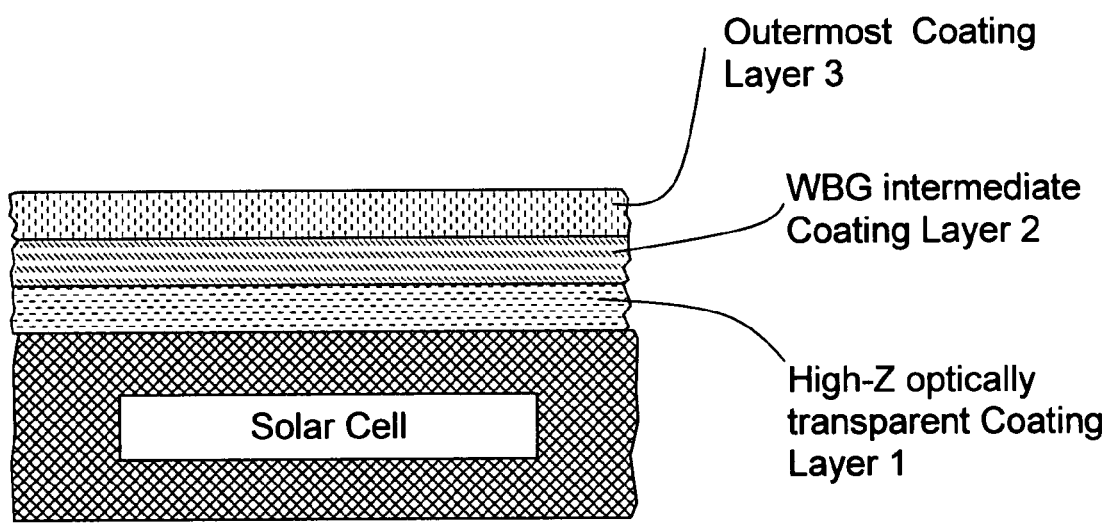
FIG. 8 Schematics of a cross section of a solar cell with a multilayer coating on glass for radiation shielding of space-based a solar cell.
Figure 9:
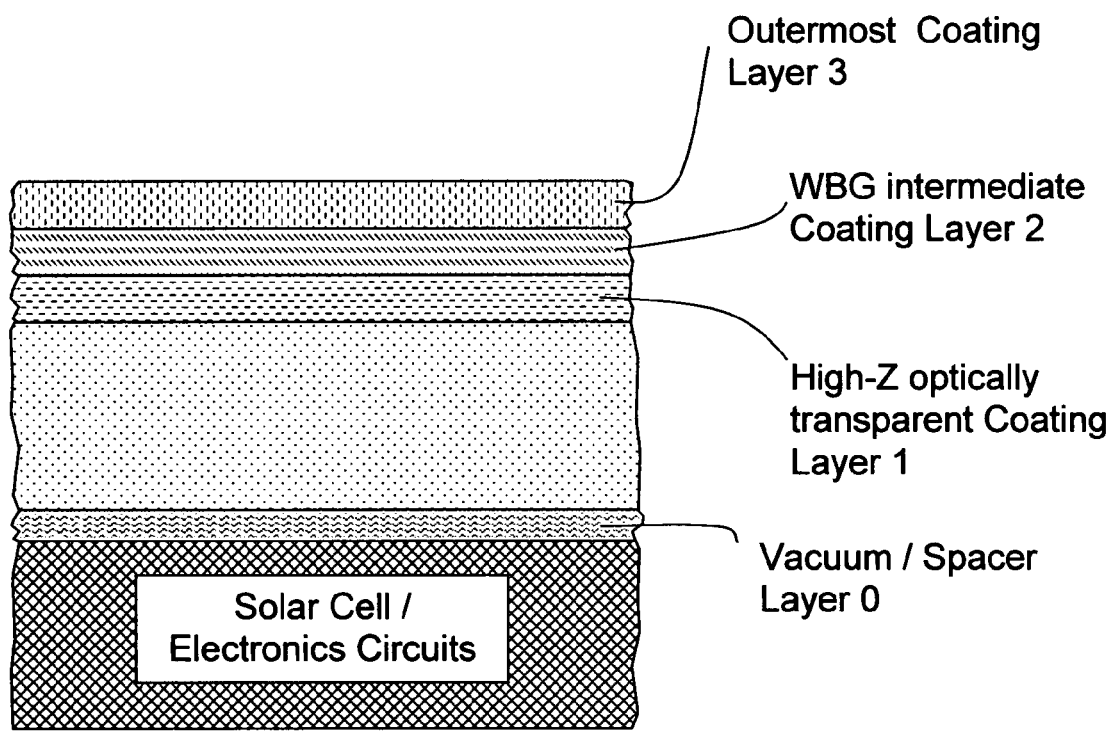
FIG. 9 Schematics of a cross section of a solar cell with a multilayer radiation shielding coatings directly on a solar cell.
Figure 10:
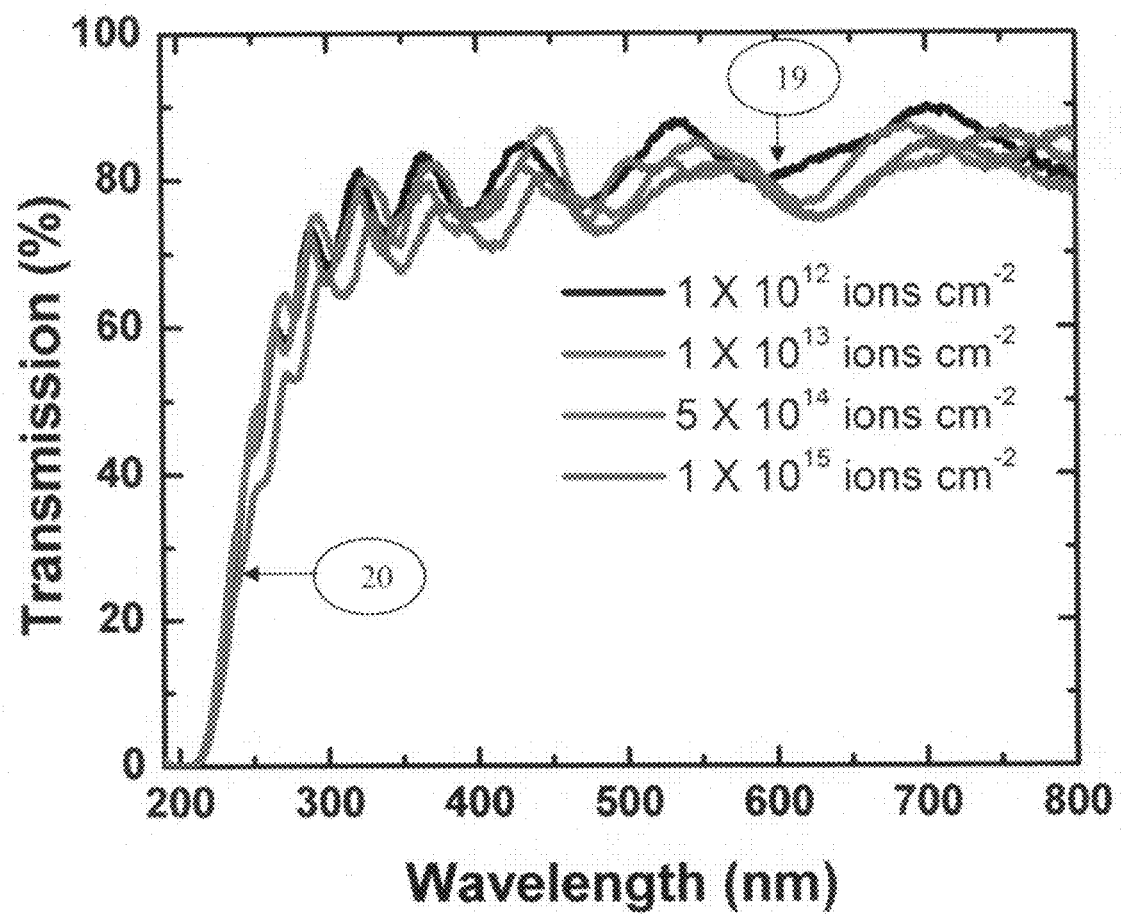
FIG. 10 Optical transparency of AlN samples after exposure to Alpha particles of dose $1\times10^{12}$, $1\times10^3$, $5\times10^{14}$, $1\times10^5$ ion $cm^{-2}$.

Thus, the invention further relates to the use of two separate strategies to protect the solar cells and/or electronic circuit or structure as described in FIGS. 7, 8, and 9. The object of specific interest, namely solar cells and or electronic structures are protected by having a shield of radiation-hard coating layer or layers separated by functional mating layer or layers. As shown in FIGS. 8 and 9, the functional mating layer 1 is composed of wide band gap (WBG) alloy of AlGaN and/or zinc and magnesium oxide represented by Zn(1−x)Mg(x)O, where x varies from 0 to 1, and functional layer 2 is composed of high-Z optically transparent and conductivity oxides or nitrides, respectively.

The selection of AlGaN is well suited for cover glass application since the composite coatings possess a strong bond strength between the constitute elements, excellent mechanical strength, high radiation hardness, and chemical inertness, wide band gaps, high optical transparency in visible region, tunable UV region, and tunable electrical conductivity. Also, the materials undoubtedly exceed radiation hardness because their lattices are dense and the displaced atoms will be forced back into their correct sites.

REFERENCES

Nitride semiconductor device, Tanizawa; Koji, Mitani; Tomotsugu, Nakagawa; Yoshinori, Takagi; Hironori, Marui; Hiromitsu, Fukuda; Yoshikatsu, Ikegami; Takeshi, U.S. Pat. No. 7,193,246

Nitride based semiconductor light-emitting device, Sugawara; Hideto U.S. Pat. No. 7,180,088

Method for making Group III nitride devices and devices produced thereby, Chai; Bruce H. T., Gallagher; John Joseph, Hill; David Wayne, U.S. Pat. No. 7,033,858

Apparatus for fabricating a III-V nitride film and a method for fabricating the same, Shibata; Tomohiko, Asai; Keiichiro, Tanaka; Mitsuhiro, U.S. Pat. No. 7,033,439

Nitride semiconductor light emitting element and production thereof, Tsuda; Yuhzoh, Hanaoka; Daisuke, Yuasa; Takayuki, Ito; Shigetoshi, Taneya; Mototaka, U.S. Pat. No. 6,984,841

Optical semiconductor device having an epitaxial layer of III-V compound semiconductor material containing N as a group V element, Kuramata; Akito, Kubota; Shinichi, Horino; Kazuhiko, Soejima; Reiko, U.S. Pat. No. 6,984,840

Semiconductor structures using a group III-nitride material system with reduced phase separation and method of fabrication, Takayama; Toru, Baba; Takaaki, Harris, Jr.; James S. U.S. Pat. No. 6,903,364

Nitride semiconductor laser element and optical device containing it, Tsuda; Yuhzoh, Yuasa; Takayuki, Ito; Shigetoshi, Taneya; Mototaka, Yamasaki; Yukio, U.S. Pat. No. 6,891,201

Semiconductor laser device and fabrication method thereof, Sawaki; Nobuhiko, Honda; Yoshio, Kameshiro; Norifumi, Yamaguchi; Masahito, Koide; Norikatsu, Ito; Shigetoshi, Ono; Tomoki, Furukawa; Katsuki, U.S. Pat. No. 6,888,867

Nitride-based semiconductor device and manufacturing method thereof, Kano; Takashi, Ohbo; Hiroki, U.S. Pat. No. 6,872,967

Semiconductor element, Hori; Yuji, Shibata; Tomohiko, Oda; Osamu, Tanaka; Mitsuhiro, U.S. Pat. No. 6,781,164

III nitride film and a III nitride multilayer, Shibata; Tomohiko, Sumiya; Shigeaki, Asai; Keiichiro, Tanaka; Mitsuhiro, U.S. Pat. No. 6,765,244

Manufacturing method of semiconductor film, Ogawa; Masahiro, Ueda; Daisuke, Ishida; Masahiro, U.S. Pat. No. 6,589,857

Method of growing GaN films with a low density of structural defects using an interlayer, Bourret-Courchesne; Edith D., U.S. Pat. No. 6,534,332

Semiconductor structures using a group III-nitride quaternary material system with reduced phase separation, Takayama; Toru, Baba; Takaaki, Harris, Jr.; James S., U.S. Pat. No. 6,521,917

Nitride semiconductor light emitting device and apparatus including the same, Tsuda; Yuhzoh, Yuasa; Takayuki, Ito; Shigetoshi, Taneya; Mototaka, U.S. Pat. No. 6,452,216

Nitride semiconductor device and method of manufacturing the same, Yagi; Shigeru, Suzuki; Toshihiko, Torigoe; Nobuyuki, Suzuki; Seiji, Iwanaga; Takeshi, U.S. Pat. No. 6,429,465

Method for fabricating a group III nitride semiconductor device, Ota; Hiroyuki, Miyachi; Mamoru, Kimura; Yoshinori, U.S. Pat. No. 6,335,218

Molecular beam epitaxial growth of GaN thin film on Si substrate with InN as interlayer, Hu F R, Ochi K, Zhao Y, Choi B S, Hane K, JOURNAL OF CRYSTAL GROWTH 294 (2): 197-201 Sep. 4, 2006

GROWTH OF SI-DOPED ALXGA1-XN ON (0001) SAPPHIRE SUBSTRATE BY METALORGANIC VAPOR-PHASE EPITAXY, MURAKAMI H, ASAHI T, AMANO H, HIRAMATSU K, SAWAKI N, AKASAKI I, JOURNAL OF CRYSTAL GROWTH 115 (1-4): 648-651 DEC 1991

GAN GROWTH USING GAN BUFFER LAYER, NAKAMURA S, JAPANESE JOURNAL OF APPLIED PHYSICS PART 2-LETTERS 30 (10A): L1705-L1707 Oct. 1, 1991

NOVEL METALORGANIC CHEMICAL VAPOR-DEPOSITION SYSTEM FOR GAN GROWTH, NAKAMURA S, HARADA Y, SENO M, APPLIED PHYSICS LETTERS 58 (18): 2021-2023 May 6, 1991

The properties of annealed AlN films deposited by pulsed laser deposition, Jones K A, Derenge M A, Zheleva T S, Kirchner K W, Ervin M H, Wood M C, Vispute R D, Sharma R P, Venkatesan T, JOURNAL OF ELECTRONIC MATERIALS 29 (3): 262-267 MAR 2000

Advances in pulsed laser deposition of nitrides and their integration with oxides, Vispute R D, Talyansky V, Sharma R P, Choopun S, Downes M, Venkatesan T, Li Y X, Salamanca-Riba L G, Iliadis A A, Jones K A, McGarrity J, APPLIED SURFACE SCIENCE 129: 431-439 MAY 1998

Growth of epitaxial GaN films by pulsed laser deposition, Vispute R D, Talyansky V, Sharma R P, Choopun S, Downes M, Venkatesan T, Jones K A, Iliadis A A, Khan M A, Yang J W, APPLIED PHYSICS LETTERS 71 (1): 102-104 Jul. 7, 1997

High quality optoelectronic grade epitaxial AlN films on alpha-Al2O3, Si and 6H—SiC by pulsed laser deposition, Vispute R D, Narayan J, Budai J D, THIN SOLID FILMS 299 (1-2): 94-103 May 15, 1997

HIGH-QUALITY EPITAXIAL ALUMINUM NITRIDE LAYERS ON SAPPHIRE BY PULSED-LASER DEPOSITION, VISPUTE R D, WU H, NARAYAN J, APPLIED PHYSICS LETTERS 67 (11): 1549-1551 Sep. 11, 1995

M. Zhu, P. Chen, R. K. Y. Fu, W. Liu, C. Lin, P. K. Chu, Applied Surface Science 239, 327-334 (2005).

What is claimed is:

1. A method for fabricating coatings and thin films of group III metal-nitride materials using electron beam evaporation, the method comprising the steps of:
    positioning at least one source of at least one group III metal in a processing chamber;
    loading a substrate in said processing chamber;
    elevating a temperature of said substrate to a selected temperature;
    filling said processing chamber with a nitridizing reaction gas at a selected pressure;
    directing an electron beam of a predetermined electron beam power level to said at least one source of the at least one group III metal; and
    controlling the electron beam power to be in the range of 6-10 kW to thereby produce a vapor of said at least one group III metal at a predetermined evaporation rate, said substrate temperature, said nitridizing reaction gas pressure and said deposition rate being selected to react said group III metal vapor with said nitridizing reaction gas during said at least one group III metal transport to said substrate to thereby deposit molecules of at least one group III metal-N on a surface of said substrate at a predetermined deposition rate and to optimize quality of resulting group III metal-N coatings and thin films;
    wherein said group III metal-N coatings and thin films are selected from a group consisting of GaN, InN, AlGaN, and InGaN.

2. The method as defined in claim 1, wherein said at least one source of the at least one group III metal includes a plurality of said sources, each source containing said at least one group III metal selected form a group consisting of Al, Ga, In, and wherein a compositional group III metal-nitride semiconductor is grown by evaporation of said group III metals from said plurality of said sources.

3. The method as defined in claim 2, wherein the composition of the group III nitride semiconductor is controlled by controlling the evaporation rate of each said group III metal.

4. The method as defined in claim 1, wherein said at least one source of the at least one group III metal includes an alloy of group III metals selected from a group consisting of AlGa, AlIn, GaIn, and combinations thereof, and
    wherein a compositional group III metal-nitride semiconductor is grown by evaporation of said alloy of group III metals.

5. The method as defined in claim 4, wherein the composition of the group III metal-nitride semiconductor is determined by the composition of the alloy of group III metals in said at least one source.

6. The method as defined in claims 1, 2, 4, 3 or 5, wherein the step of loading a substrate includes loading a substrate includes space-based solar cells to thereby form said coating thereon as a radiation shield therefore.

7. The method as defined in claim 1, wherein the step of elevating a temperature of said substrate includes elevating the substrate temperature to be in the range of 400° C.-800° C. the step of filling said processing chamber with a nitridizing reaction gas includes pressurizing said nitridizing reaction gas to a pressure in the range of $10^{-1}$ Torr-$10^{-8}$ Torr; and said predetermined deposition rate is in the range of 3-4 Å/s.

* * * * *